(12) United States Patent
Park et al.

(10) Patent No.: US 12,322,733 B2
(45) Date of Patent: Jun. 3, 2025

(54) DISPLAY DEVICE USING SEMICONDUCTOR LIGHT-EMITTING ELEMENTS, AND METHOD FOR MANUFACTURING SAME

(71) Applicant: LG ELECTRONICS INC., Seoul (KR)

(72) Inventors: Changseo Park, Seoul (KR); Seongmin Moon, Seoul (KR); Kiseong Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 865 days.

(21) Appl. No.: 17/430,537

(22) PCT Filed: Sep. 2, 2019

(86) PCT No.: PCT/KR2019/011243
§ 371 (c)(1),
(2) Date: Mar. 17, 2022

(87) PCT Pub. No.: WO2020/166777
PCT Pub. Date: Aug. 20, 2020

(65) Prior Publication Data
US 2022/0246583 A1 Aug. 4, 2022

(30) Foreign Application Priority Data

Feb. 13, 2019 (KR) .................. 10-2019-0016910

(51) Int. Cl.
*H01L 27/15* (2006.01)
*H01L 25/075* (2006.01)
(Continued)

(52) U.S. Cl.
CPC ..... *H01L 25/0753* (2013.01); *H10H 20/8312* (2025.01); *H10H 20/84* (2025.01); *H10H 20/857* (2025.01)

(58) Field of Classification Search
CPC ... H01L 25/0753; H01L 33/382; H01L 33/44; H01L 33/62; H01L 33/504;
(Continued)

(56) References Cited

U.S. PATENT DOCUMENTS

2013/0168708 A1 7/2013 Shibata et al.
2017/0077348 A1* 3/2017 Lim .................. H01L 33/44
(Continued)

FOREIGN PATENT DOCUMENTS

EP 3 270 424 A1 1/2018
KR 10-2013-0033450 A 4/2013
(Continued)

*Primary Examiner* — Theresa T Doan
(74) *Attorney, Agent, or Firm* — Birch, Stewart, Kolasch & Birch, LLP

(57) ABSTRACT

A display device according to an example of the present disclosure includes a pair of assembly electrodes spaced apart from each other on a substrate, a semiconductor light emitting device assembled on the pair of assembly electrodes, a photosensitive organic insulator applied to a space between the semiconductor light emitting device and the substrate and between the pair of assembly electrodes to fix the semiconductor light emitting device to the substrate, and an insulating layer disposed between the pair of assembly electrodes and the semiconductor light emitting device.

20 Claims, 16 Drawing Sheets

(51) Int. Cl.
*H01L 31/12* (2006.01)
*H10H 20/831* (2025.01)
*H10H 20/84* (2025.01)
*H10H 20/857* (2025.01)

(58) Field of Classification Search
CPC ..... H01L 2933/0016; H01L 2933/0066; H01L 27/156; H01L 27/1237; H01L 27/1259
USPC .......................................................... 257/79
See application file for complete search history.

(56) References Cited

U.S. PATENT DOCUMENTS

| | | | |
|---|---|---|---|
| 2018/0019377 A1* | 1/2018 | Kim | .................. H01L 33/38 |
| 2018/0061669 A1* | 3/2018 | Liao | .................. H01L 21/563 |
| 2018/0175009 A1 | 6/2018 | Kim et al. | |
| 2018/0182741 A1 | 6/2018 | Sung et al. | |
| 2018/0197899 A1 | 7/2018 | Bae et al. | |
| 2018/0342691 A1 | 11/2018 | Lu | |
| 2019/0035980 A1 | 1/2019 | Do et al. | |
| 2019/0244567 A1 | 8/2019 | Cho et al. | |

FOREIGN PATENT DOCUMENTS

| | | |
|---|---|---|
| KR | 10-2017-0026956 A | 3/2017 |
| KR | 10-2017-0091805 A | 8/2017 |
| KR | 10-2018-0009014 A | 1/2018 |
| KR | 10-2018-0077114 A | 7/2018 |
| KR | 10-2019-0096475 A | 8/2019 |
| WO | WO 2018/135704 A1 | 7/2018 |

\* cited by examiner

[FIG. 1]
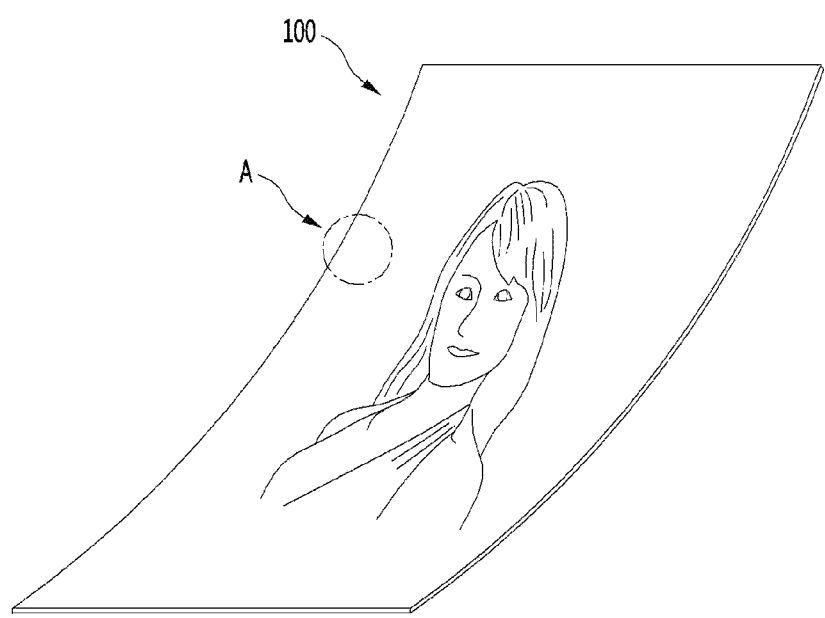

[FIG. 2]
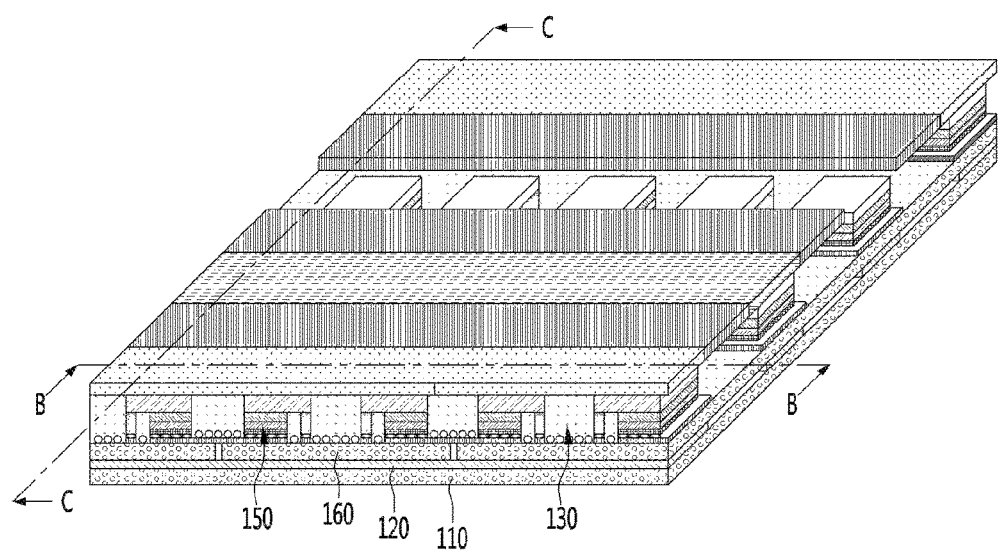
[FIG. 3A]
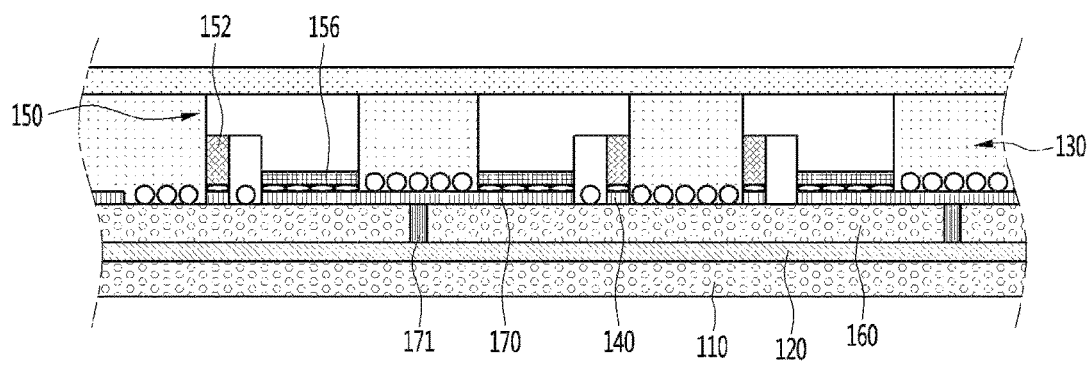

[FIG. 3B]
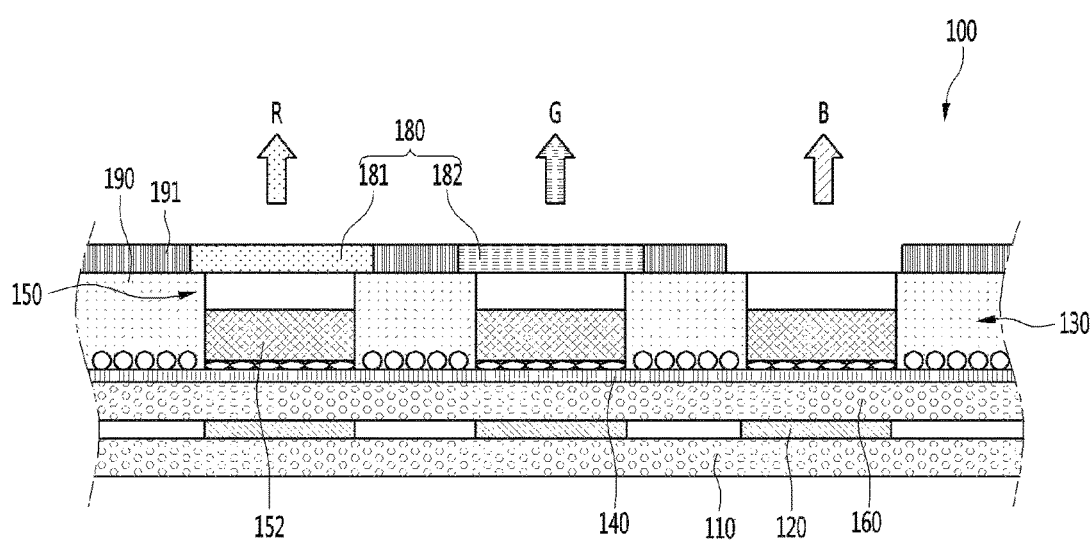

[FIG. 4]
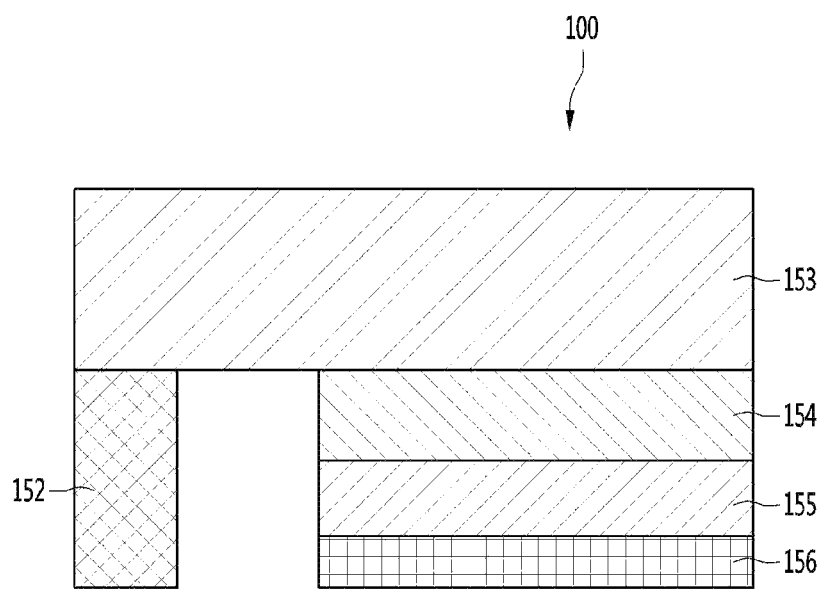
[FIG. 5A]
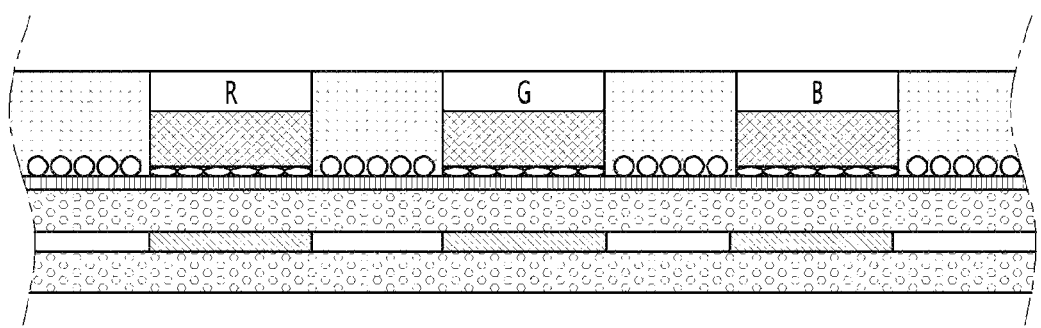

【FIG. 5B】
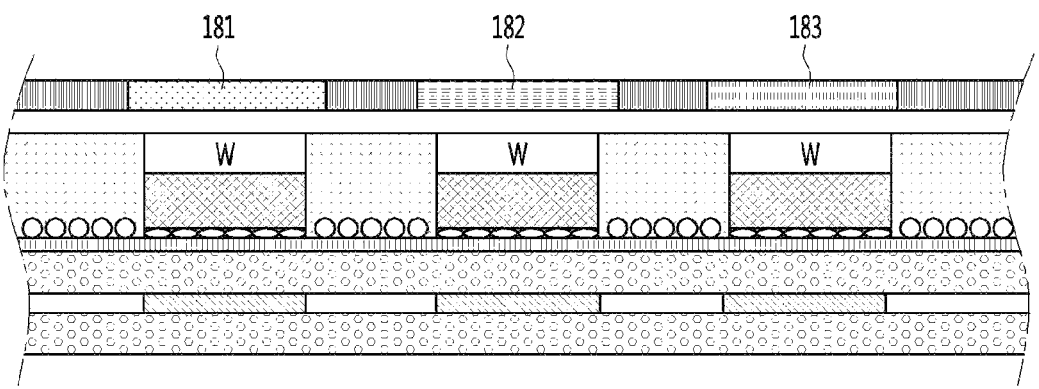
【FIG. 5C】
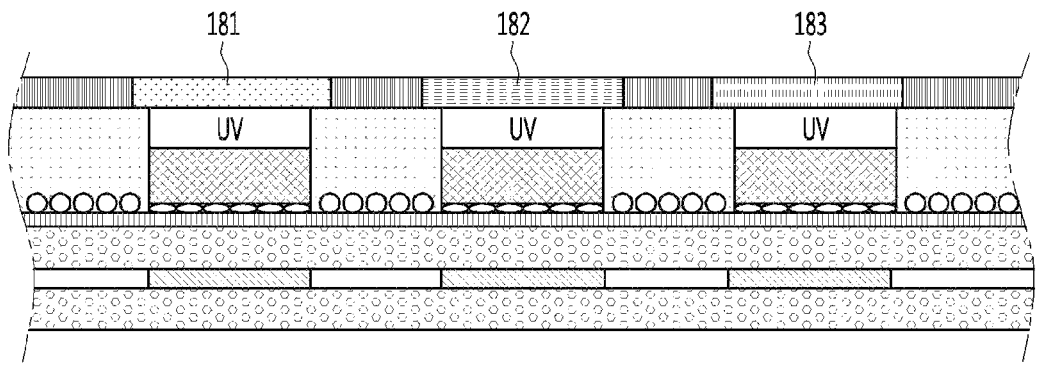

[FIG. 6]
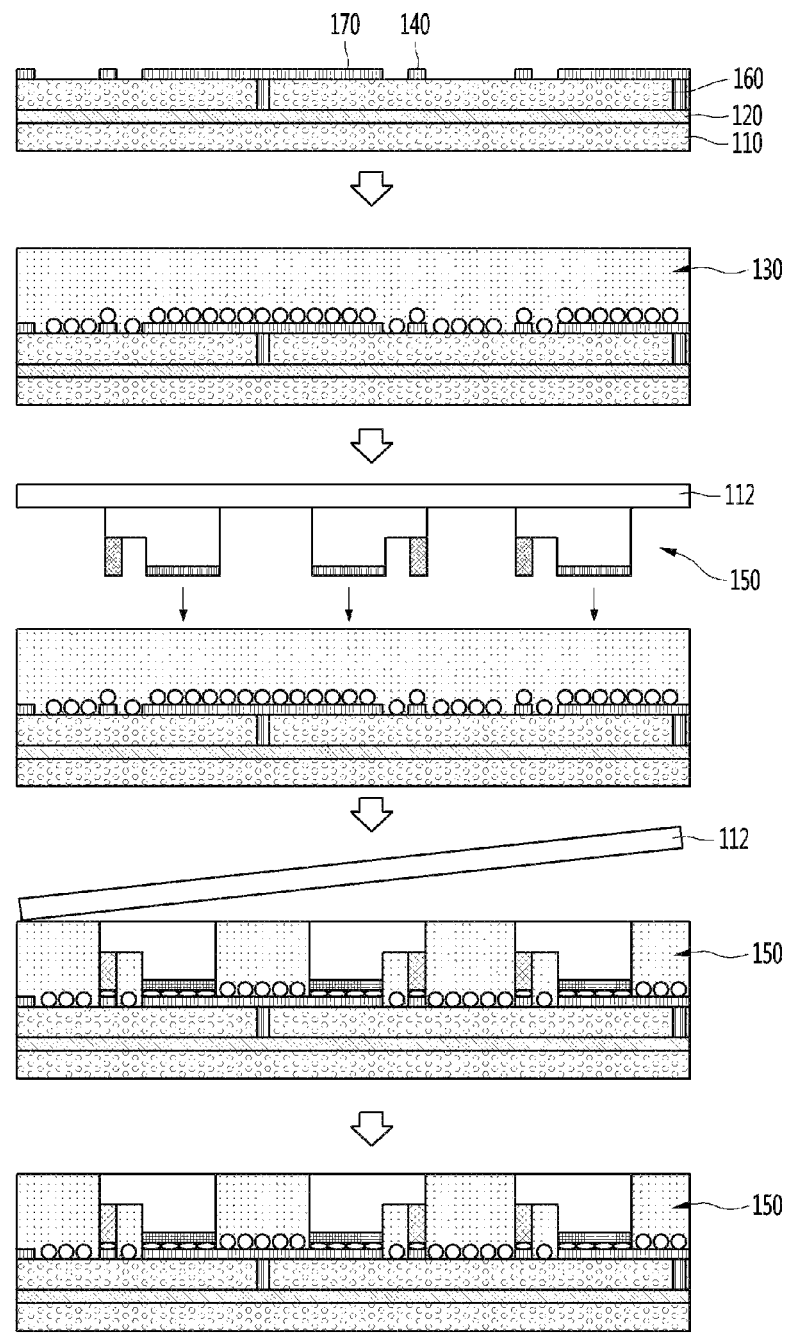

【FIG. 7】
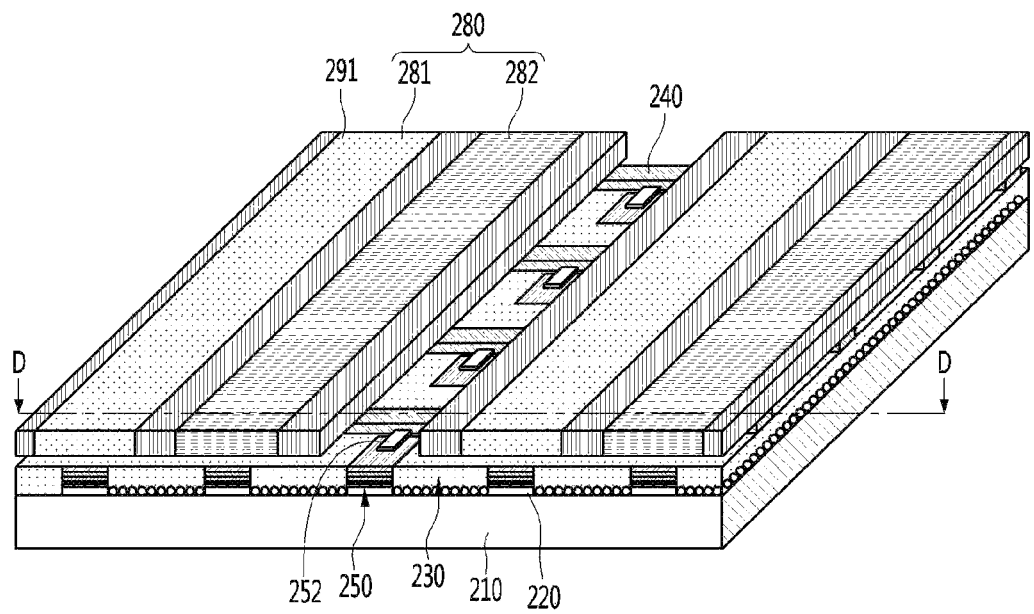
【FIG. 8】
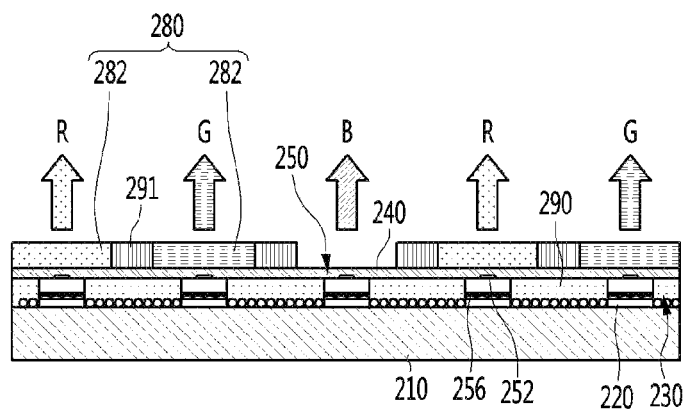

[FIG. 9]
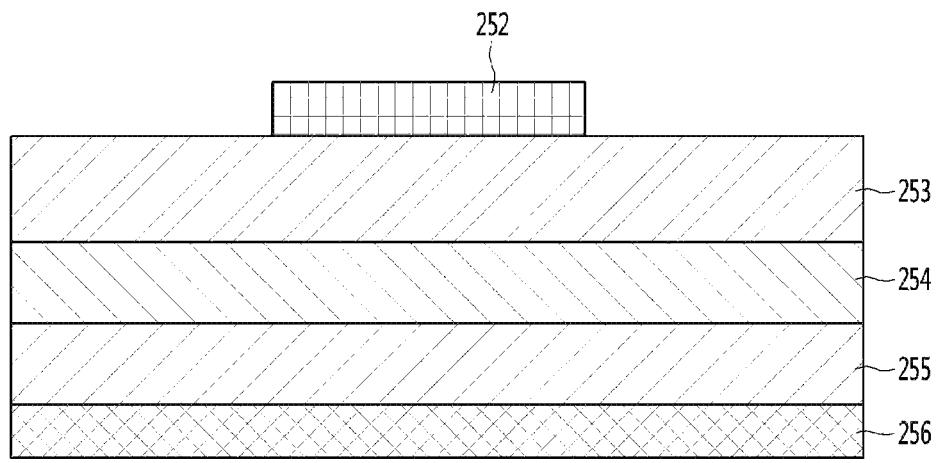
[FIG. 10]
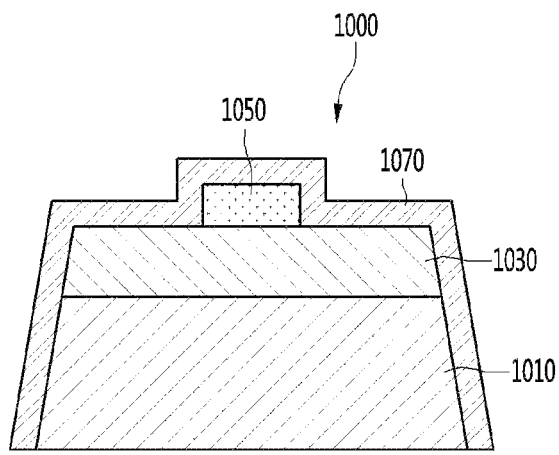

【FIG. 11】
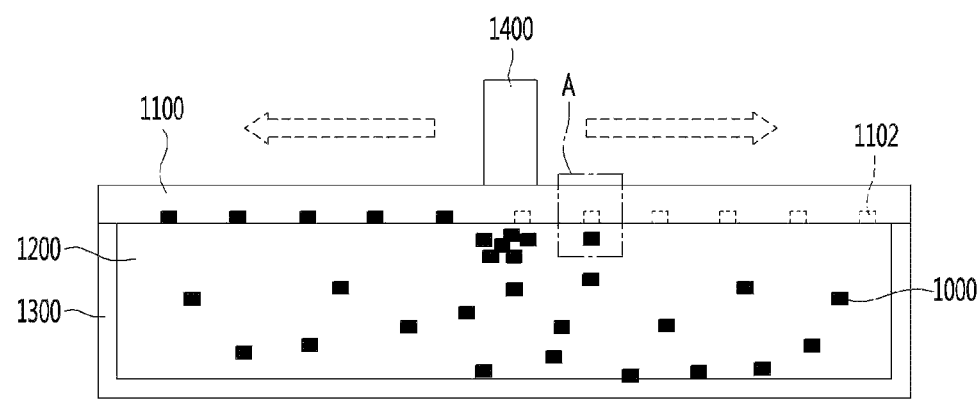
【FIG. 12】
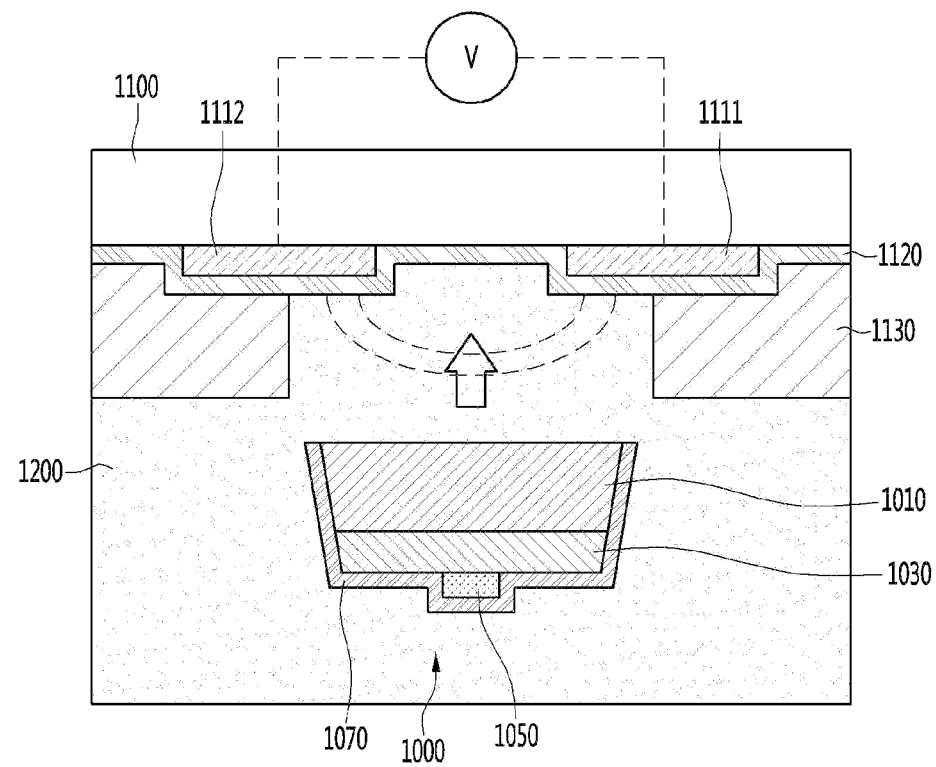

[FIG. 13A]
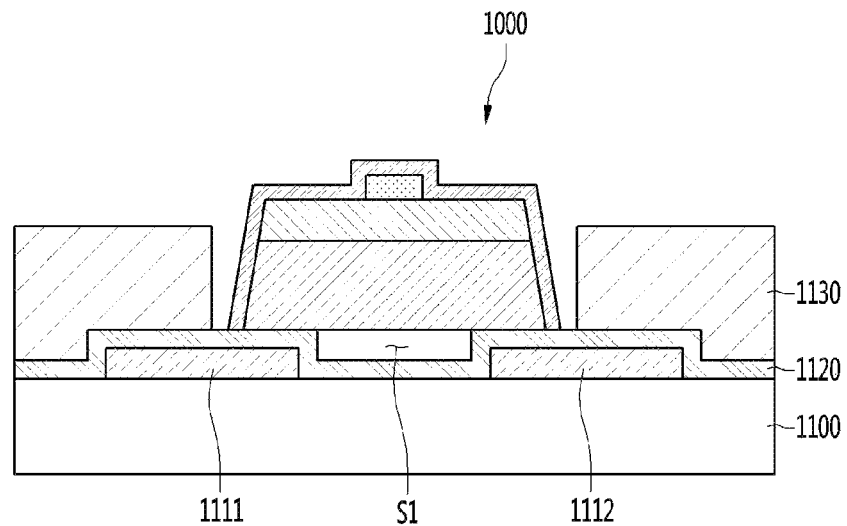
[FIG. 13B]
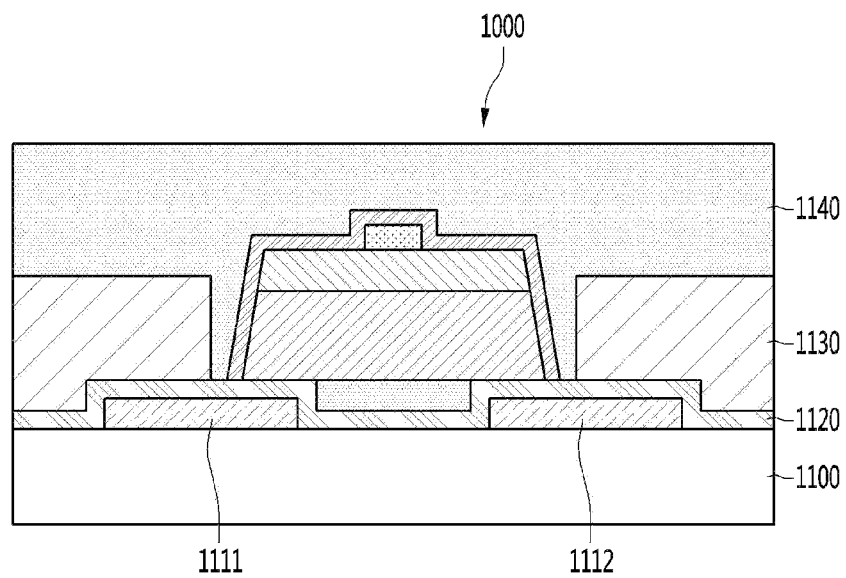

[FIG. 13C]
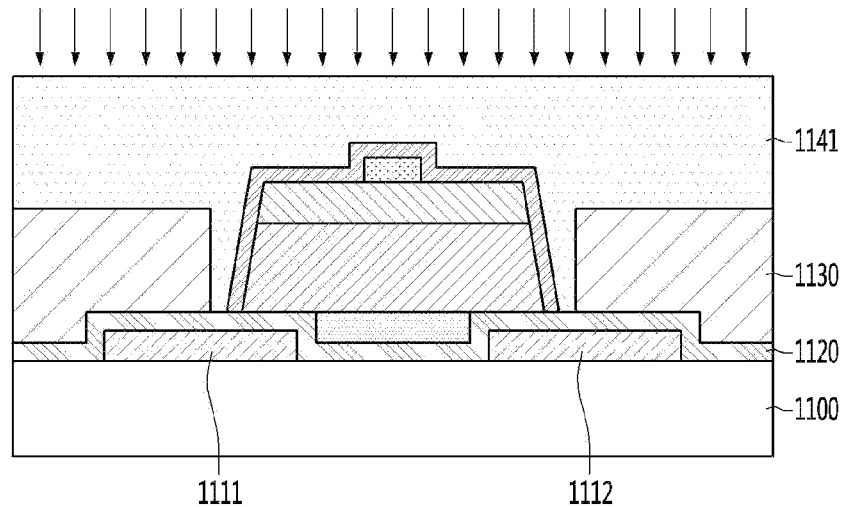
[FIG. 13D]
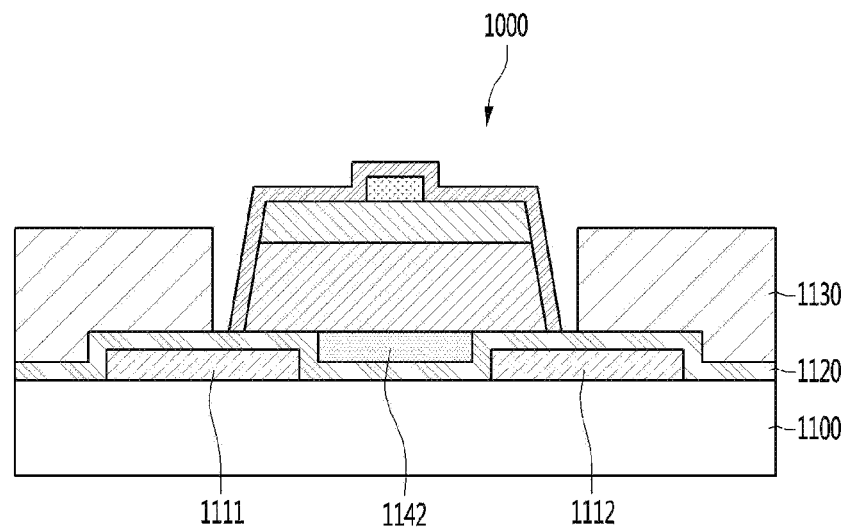

【FIG. 14A】
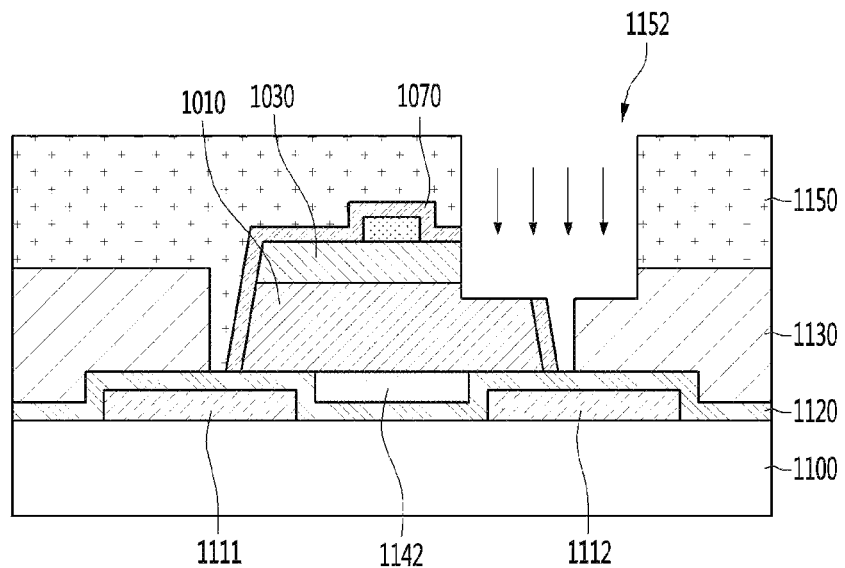
【FIG. 14B】
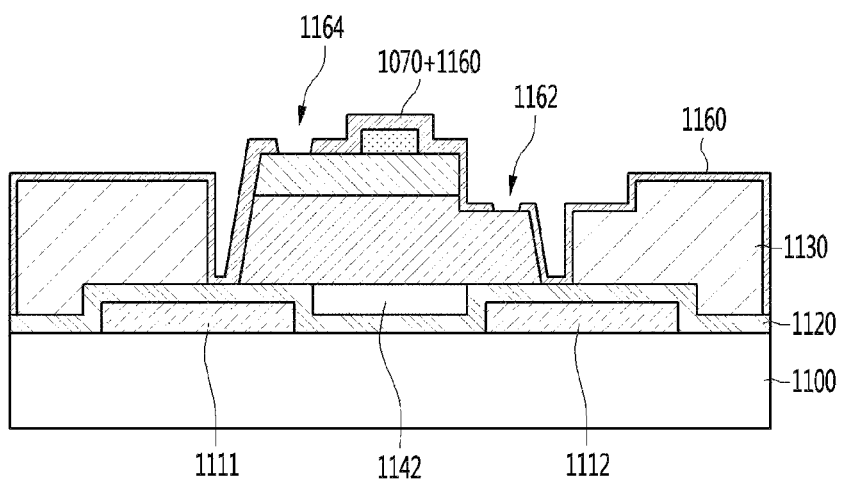

[FIG. 14C]
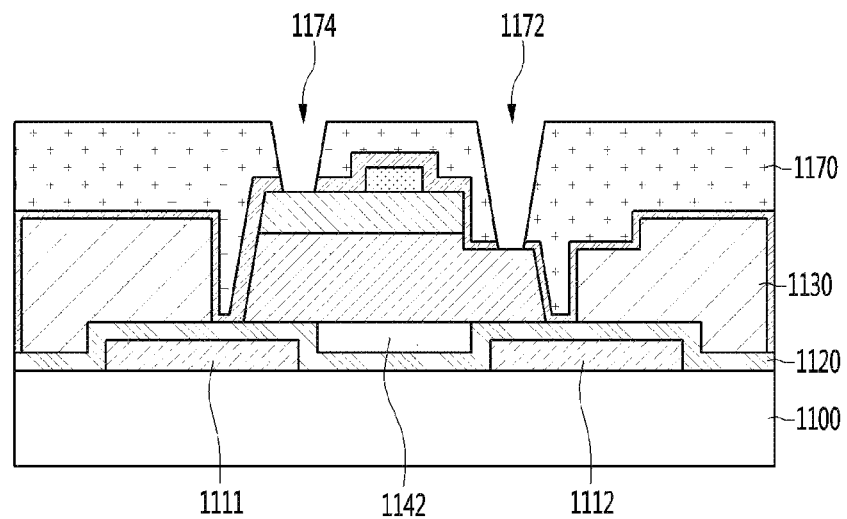
[FIG. 14D]
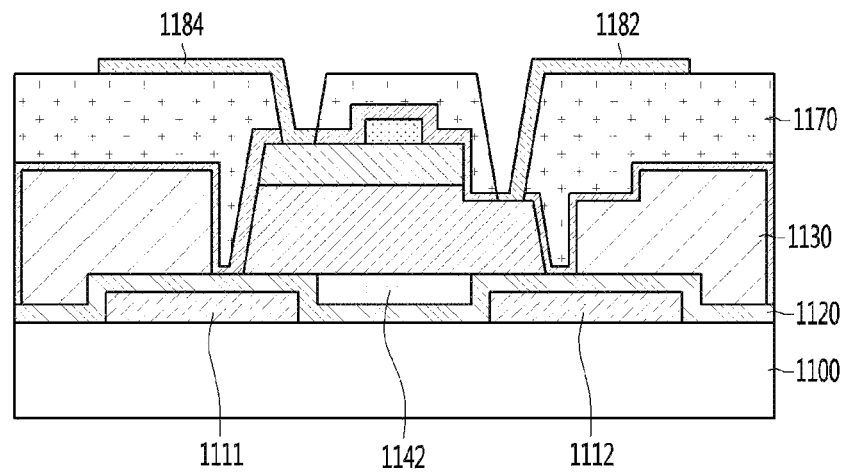

【FIG. 15】
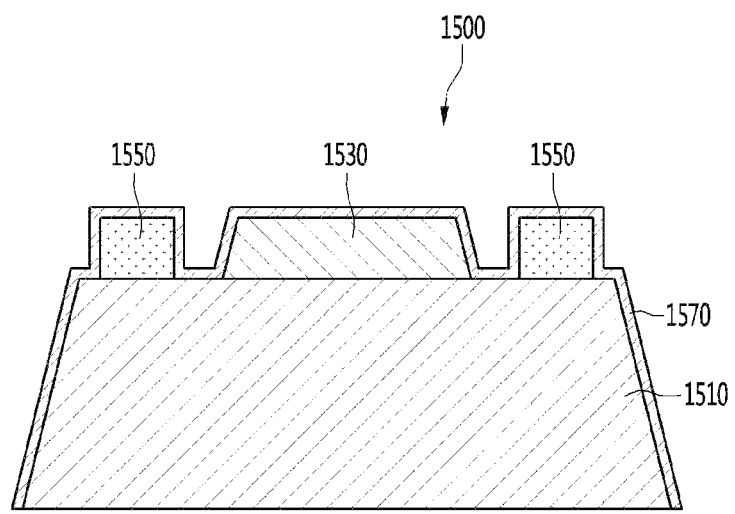
【FIG. 16A】
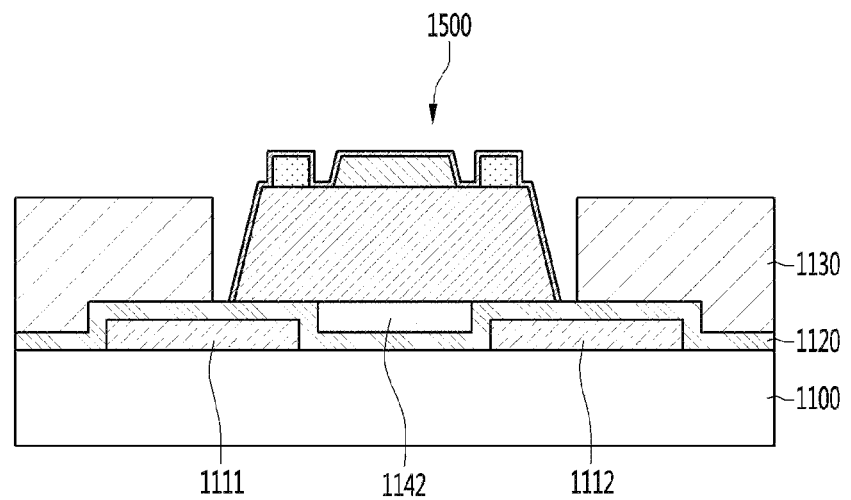

【FIG. 16B】
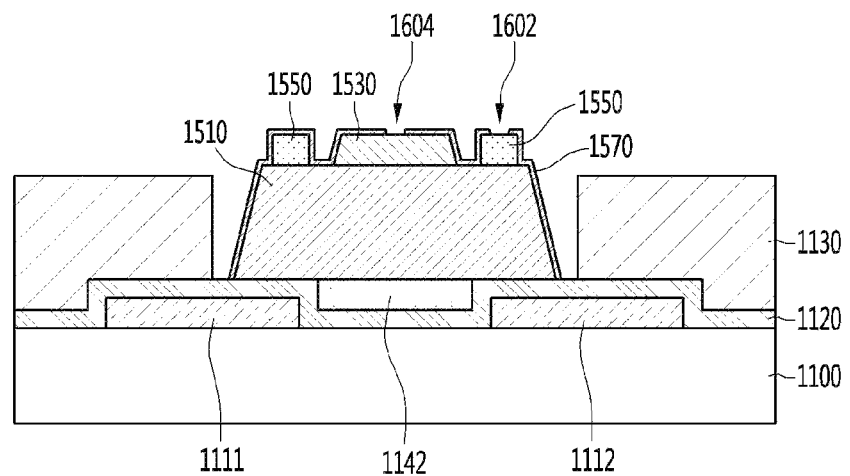
【FIG. 16C】
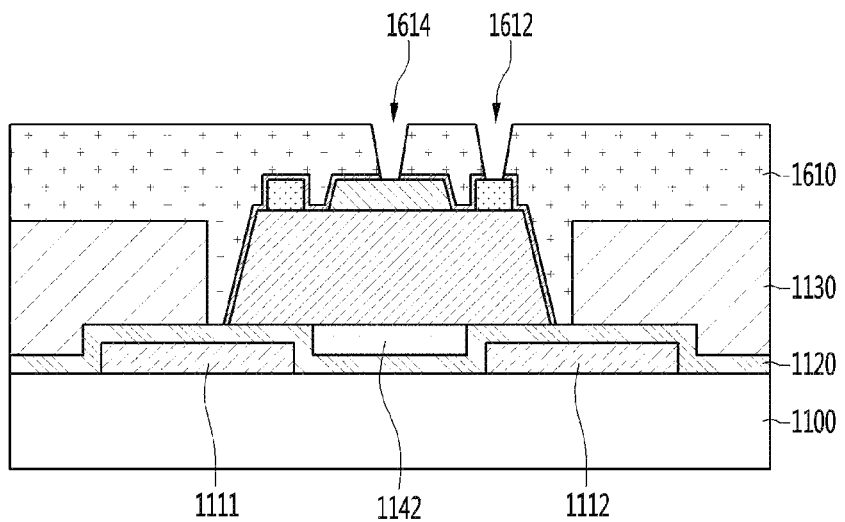

[FIG. 16D]
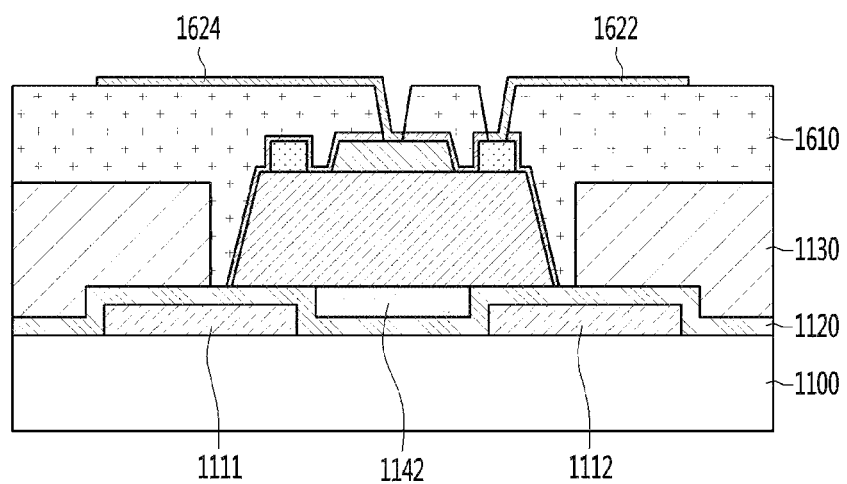

DISPLAY DEVICE USING SEMICONDUCTOR LIGHT-EMITTING ELEMENTS, AND METHOD FOR MANUFACTURING SAME

CROSS REFERENCE TO RELATED APPLICATIONS

This application is the National Stage filing under 35 U.S.C. 371 of International Application No. PCT/KR2019/011243, filed on Sep. 2, 2019, which claims the benefit of earlier filing date and right of priority to Korean Application No. 10-2019-0016910, filed on Feb. 13, 2019 in the Republic of Korea, the contents of all these applications being hereby expressly incorporated by reference into the present application.

TECHNICAL FIELD

The present invention relates to a display device using a semiconductor light emitting device and a method for manufacturing the same.

BACKGROUND ART

Recently, in the field of display technology, display devices having excellent characteristics such as thinness and flexibility have been developed. On the other hand, currently commercialized main displays are represented by LCD (Liquid Crystal Display) and AMOLED (Active Matrix Organic Light Emitting Diodes).

However, in the case of LCD, there are problems in that the response time is not fast and flexible implementation is difficult, and in the case of AMOLED, there are weaknesses in that the lifespan is short and the mass production yield is not good.

Meanwhile, a light emitting diode (Light Emitting Diode: LED) is a well-known semiconductor light emitting device that converts electric current into light. Starting with the commercialization of a red LED using a GaAsP compound semiconductor in 1962, a GaP:N-based green LED has been used as a light source for display images of electronic devices including information and communication devices. Accordingly, a method for solving the above problems by implementing a display using the semiconductor light emitting device may be proposed. Such a light emitting diode has various advantages, such as a long lifespan, low power consumption, excellent initial driving characteristics, and high vibration resistance, compared to a filament-based light emitting device.

On the other hand, in the case of a display using a semiconductor light emitting device, since the semiconductor light emitting device corresponding to each pixel must be coupled to the substrate, it may be relatively difficult to implement a large-screen high-pixel display. Accordingly, recently, a self-assembly method in which semiconductor light emitting devices injected into a fluid are moved to a substrate using an electromagnetic field and then assembled has been developed.

However, although the semiconductor light emitting device assembled by moving to the substrate can be maintained in an assembled state by an electric field, a method for more effectively fixing the semiconductor light emitting device through a physical or chemical fixing method may be required.

DISCLOSURE

Technical Problem

An object of the present invention is to provide a method of manufacturing a display device capable of effectively fixing a semiconductor light emitting device assembled to a substrate by a self-assembly method using an electromagnetic field.

Technical Solution

A method of manufacturing a display device according to an embodiment of the present invention may include assembling semiconductor light emitting devices on a substrate, applying a photosensitive organic insulator on the semiconductor light emitting devices and the substrate, and forming the semiconductor light emitting devices and removing the photosensitive organic insulator in the remaining area except for the space between lower portions and the substrate, and curing the photosensitive organic insulator filled in the space.

According to an embodiment, the assembling of the semiconductor light emitting devices to the substrate may include contacting the semiconductor light emitting devices to the substrate using an assembling device having a magnetic material, and through an assembly electrode formed on the substrate. The method may include assembling the semiconductor light emitting devices to the substrate based on the applied electric field.

The assembly electrode may include a pair of assembly electrodes spaced apart from each other, and the space may be located between the pair of assembly electrodes.

According to an embodiment, the photosensitive organic insulator may include a photosensitive agent having a positive tone, such as a photosensitive acrylate or PAC (Photo Active Compounds).

In some embodiments, the removing of the photosensitive organic insulator may include irradiating ultraviolet light onto the semiconductor light emitting devices and the substrate.

A display device according to an embodiment of the present invention may include a substrate, a pair of assembly electrodes spaced apart from each other on the substrate, a semiconductor light emitting device assembled on the pair of assembly electrodes, a photosensitive organic insulator applied to a space between the semiconductor light emitting device and the substrates and between the pair of assembly electrodes to fix the semiconductor light emitting device to the substrate.

In some embodiments, a distance between the pair of assembly electrodes may be shorter than a horizontal width of the semiconductor light emitting device.

According to an embodiment, a coupling hole defining an assembly position of the semiconductor light emitting device may be formed on the substrate, and the coupling hole may correspond to a space between partition walls formed on the substrate.

In some embodiments, a width of the coupling hole may be greater than a width of the semiconductor light emitting device.

In some embodiments, the semiconductor light emitting device may include a magnetic layer.

Advantageous Effects

According to an embodiment of the present invention, since the semiconductor light emitting device can be fixed to the substrate through the application and exposure processes of the photosensitive organic insulator, the semiconductor light emitting device can be effectively fixed with a simple process.

In addition, according to an embodiment of the present invention, since the semiconductor light emitting device can be fixed to the substrate without pressure being applied to the semiconductor light emitting device or the substrate, deformation or damage to the semiconductor light emitting device or the substrate due to the pressure can be prevented.

DESCRIPTION OF DRAWINGS

FIG. 1 is a conceptual diagram illustrating an embodiment of a display device using a semiconductor light emitting device of the present invention.

FIG. 2 is a partially enlarged view of part A of FIG. 1, and FIGS. 3A and 3B are cross-sectional views taken along lines B-B and C-C of FIG. 2 respectively.

FIG. 4 is a conceptual diagram illustrating the flip-chip type semiconductor light emitting device of FIG. 3A.

FIGS. 5A to 5C are conceptual views illustrating various forms of implementing colors in relation to a flip-chip type semiconductor light emitting device.

FIG. 6 is a cross-sectional view showing a method of manufacturing a display device using the semiconductor light emitting device of the present invention.

FIG. 7 is a perspective view showing another embodiment of a display device using the semiconductor light emitting device of the present invention.

FIG. 8 is a cross-sectional view taken along line D-D in FIG. 7.

FIG. 9 is a conceptual diagram illustrating a vertical semiconductor light emitting device of FIG. 8.

FIG. 10 is a diagram schematically illustrating a structure of a semiconductor light emitting device according to another embodiment of the present invention.

FIG. 11 is a view showing an embodiment of a method in which the semiconductor light emitting device having the structure shown in FIG. 10 is assembled on a substrate by a self-assembly method.

FIG. 12 is an enlarged view of part A of FIG. 11.

FIGS. 13A to 13D are cross-sectional views illustrating a process for fixing the semiconductor light emitting device according to the embodiment of FIG. 10 to a substrate.

FIGS. 14A to 14D are cross-sectional views illustrating a method of manufacturing a display device using the semiconductor light emitting device according to the embodiment of FIG. 10.

FIG. 15 is a diagram schematically illustrating a structure of a semiconductor light emitting device according to another embodiment of the present invention.

FIGS. 16A to 16D are cross-sectional views illustrating a method of manufacturing a display device using a semiconductor light emitting device according to the embodiment of FIG. 15.

MODE FOR INVENTION

Hereinafter, the embodiments disclosed in the present specification will be described in detail with reference to the accompanying drawings, but the same or similar elements are given the same reference numbers regardless of reference numerals, and redundant description thereof will be omitted. The suffixes "module" and "part" for elements used in the following description are given or mixed in consideration of only the ease of writing the specification, and do not have distinct meanings or roles by themselves. In addition, in describing the embodiments disclosed in the present specification, if it is determined that detailed descriptions of related known technologies may obscure the gist of the embodiments disclosed in the present specification, the detailed description thereof will be omitted. In addition, it should be noted that the accompanying drawings are only for easy understanding of the embodiments disclosed in the present specification, and should not be construed as limiting the technical spirit disclosed in the present specification by the accompanying drawings.

Also, when an element, such as a layer, region, or substrate, is referred to as being "on" another element, it will be understood that it may be directly on the other element or intervening elements may be present in between.

The display device described in this specification may include a mobile phone, a smart phone, a laptop computer, a digital broadcasting terminal, a personal digital assistant (PDA), a portable multimedia player (PMP), a navigation system, a slate PC (Slate PC), Tablet PC, Ultra Book, digital TV, desktop computer, and the like. However, it will be readily apparent to those skilled in the art that the configuration according to the embodiment described herein may be applied to a display capable device even in a new product form to be developed later.

FIG. 1 is a conceptual diagram illustrating an embodiment of a display device 100 using a semiconductor light emitting device of the present invention.

As shown in the drawings, information processed by a control unit of the display apparatus 100 may be displayed using a flexible display.

A flexible display may include a display that can be bent, crooked, twisted, folded, or rolled by an external force. For example, the flexible display may be a display manufactured on a thin and flexible substrate that can be bent, crooked, folded, or rolled like paper while maintaining the display characteristics of existing flat panel display.

In a state in which the flexible display is not bent (for example, a state having an infinite radius of curvature, hereinafter referred to as a first state), the display area of the flexible display becomes a flat surface. In a state bent by an external force in the first state (for example, a state having a finite radius of curvature, hereinafter referred to as a second state), the display area may be a curved surface. As illustrated, the information displayed in the second state may be visual information output on the curved surface. Such visual information can be implemented by independently controlling the light emission of sub-pixels arranged in a matrix form. The unit pixel means a minimum unit for realizing one color.

The unit pixel of the flexible display may be implemented by a semiconductor light emitting device. In the present invention, a light emitting diode (LED) is exemplified as a type of a semiconductor light emitting device that converts current into light. The light emitting diode is formed in a small size, so that it can serve as a unit pixel even in the second state.

Hereinafter, a flexible display implemented using the light emitting diode will be described in more detail with reference to the drawings.

FIG. 2 is a partially enlarged view of part A of FIG. 1, FIGS. 3A and 3B are cross-sectional views taken along lines B-B and C-C of FIG. 2, and FIG. 4 is a conceptual diagram of a flip-chip type semiconductor light emitting device of FIG. 3A. And FIGS. 5A to 5C are conceptual diagrams illustrating various forms of implementing colors in relation to a flip-chip type semiconductor light emitting device.

Referring to FIGS. 2, 3A and 3B, the display device 100 using a semiconductor light emitting device of a passive matrix (PM) method can be exemplified as the display device 100 using a semiconductor light emitting device. However, the examples described below can be also applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. For example, in order to implement a flexible display device, the substrate 110 may include glass or polyimide (PD. In addition, any material such as polyethylene naphthalate (PEN) or polyethylene terephthalate (PET) may be used as long as it has insulating properties and is flexible. In addition, the substrate 110 may be made of either a transparent material or an opaque material.

The substrate 110 may be a wiring substrate on which the first electrode 120 is disposed, and thus, the first electrode 120 may be located on the substrate 110.

As shown in the drawings, the insulating layer 160 may be disposed on the substrate 110 on which the first electrode 120 is positioned, and the auxiliary electrode 170 may be positioned on the insulating layer 160. In this case, a state in which the insulating layer 160 is laminated on the substrate 110 may be a single wiring board. More specifically, the insulating layer 160 is made of an insulating and flexible material such as polyimide (PI, Polyimide), PET, or PEN, and may be integrally formed with the substrate 110 to form a single substrate.

The auxiliary electrode 170 can be an electrode that electrically connects the first electrode 120 and the semiconductor light emitting device 150, and can be located on the insulating layer 160, and can be placed corresponding to a position of the first electrode 120. For example, the auxiliary electrode 170 may have a dot shape and may be electrically connected to the first electrode 120 by an electrode hole 171 penetrating the insulating layer 160. The electrode hole 171 may be formed by filling the via hole with a conductive material.

Referring to the drawings, the conductive adhesive layer 130 can be formed on one surface of the insulating layer 160, but the present invention is not limited thereto. For example, a layer performing a specific function can be formed between the insulating layer 160 and the conductive adhesive layer 130, or the conductive adhesive layer 130 can be disposed on the substrate 110 without the insulating layer 160. In a structure in which the conductive adhesive layer 130 is disposed on the substrate 110, the conductive adhesive layer 130 may serve as an insulating layer.

The conductive adhesive layer 130 may be a layer having adhesiveness and conductivity, and for this purpose, a material having conductivity and a material having adhesiveness may be mixed in the conductive adhesive layer 130. In addition, the conductive adhesive layer 130 has ductility, thereby enabling a flexible function in the display device.

For this example, the conductive adhesive layer 130 may be an anisotropic conductive film (ACF), an anisotropic conductive paste, a solution containing conductive particles, or the like. The conductive adhesive layer 130 may be configured as a layer that allows electrical interconnection in the Z direction passing through the thickness, but has electrical insulation in the horizontal X-Y direction. Accordingly, the conductive adhesive layer 130 may be referred to as a Z-axis conductive layer (hereinafter, referred to as 'conductive adhesive layer').

The anisotropic conductive film can be a film in which an anisotropic conductive medium is mixed with an insulating base member, and when heat and pressure are applied, only a specific portion has conductivity by the anisotropic conductive medium. Hereinafter, it will be described that heat and pressure are applied to the anisotropic conductive film, but other methods are also possible in order for the anisotropic conductive film to have partial conductivity. In this method, for example, only one of the heat and pressure may be applied or UV curing may be performed.

In addition, the anisotropic conductive medium may be, for example, conductive balls or conductive particles. As shown in the drawings, in this example, the anisotropic conductive film can be a film in which conductive balls are mixed with an insulating base member, and when heat and pressure are applied, only a specific portion has conductivity by the conductive balls. The anisotropic conductive film may be in a state in which the core of the conductive material contains a plurality of particles covered by an insulating film made of a polymer material, and in this case, the portion to which heat and pressure is applied breaks the insulating film and has conductivity by the core. At this time, the shape of the core may be deformed to form a layer in contact with each other in the thickness direction of the film. As a more specific example, heat and pressure are applied as a whole to the anisotropic conductive film, and electrical connection in the Z-axis direction is partially formed due to a height difference of an object adhered by the anisotropic conductive film.

As another example, the anisotropic conductive film may be in a state in which an insulating core contains a plurality of particles coated with a conductive material. In this case, the conductive material can be deformed (pressed) in the portion to which heat and pressure are applied, so that it has conductivity in the thickness direction of the film. As another example, a form in which the conductive material penetrates the insulating base member in the Z-axis direction to have conductivity in the thickness direction of the film is also possible. In this case, the conductive material may have a pointed end.

As shown in the drawings, the anisotropic conductive film may be a fixed array anisotropic conductive film (ACF) in which conductive balls are inserted into one surface of the insulating base member. More specifically, the insulating base member can be formed of a material having an adhesive property, and the conductive balls are intensively disposed on a bottom of the insulating base member, and when heat and pressure are applied from the base member, it can be deformed together with the conductive balls. Accordingly, it has conductivity in the vertical direction.

However, the present invention is not limited thereto, and the anisotropic conductive film has a form in which conductive balls are randomly mixed in an insulating base member, or is composed of a plurality of layers, and conductive balls are arranged on one layer (double-ACF), etc. are all possible.

The anisotropic conductive paste is a combination of a paste and a conductive ball, and may be a paste in which a conductive ball is mixed with an insulating and adhesive base material. Also, a solution containing conductive particles may be a solution containing conductive particles or nano particles.

Referring back to the drawing, the second electrode 140 can be spaced apart from the auxiliary electrode 170 and can be located in the insulating layer 160. That is, the conductive adhesive layer 130 can be disposed on the insulating layer 160 in which the auxiliary electrode 170 and the second electrode 140 are located.

After the conductive adhesive layer 130 is formed in the state where the auxiliary electrode 170 and the second electrode 140 are positioned on the insulating layer 160, the semiconductor light emitting device 150 can be heated and applied to a flip chip by pressure such that the semiconductor light emitting device 150 can be electrically connected to the first electrode 120 and the second electrode 140.

Referring to FIG. 4, the semiconductor light emitting device may be a flip chip type light emitting device.

For example, in the semiconductor light emitting device may include a p-type electrode 156, a p-type semiconductor layer 155 on which the p-type electrode 156 is formed, and an active layer 154 formed on the p-type semiconductor layer 155, an n-type semiconductor layer 153 formed on the active layer 154 and an n-type electrode 152 spaced apart from the p-type electrode 156 in the horizontal direction on the n-type semiconductor layer 153. In this case, the p-type electrode 156 may be electrically connected to the auxiliary electrode 170 and the conductive adhesive layer 130, and the n-type electrode 152 may be electrically connected to the second electrode 140.

Referring back to FIGS. 2, 3A, and 3B, the auxiliary electrode 170 may be formed to be elongated in one direction, so that one auxiliary electrode can be electrically connected to the plurality of semiconductor light emitting devices 150. For example, p-type electrodes of left and right semiconductor light emitting devices with respect to the auxiliary electrode may be electrically connected to one auxiliary electrode.

More specifically, the semiconductor light emitting device 150 is pressed into the conductive adhesive layer 130 by heat and pressure, and through this, only the portion between the p-type electrode 156 and the auxiliary electrode 170 of the semiconductor light emitting device 150 and the portion between the n-type electrode 152 and the second electrode 140 of the semiconductor light emitting device 150 are pressed and have conductivity, and there is no press-fitting of the semiconductor light emitting device in the remaining portion. As described above, the conductive adhesive layer 130 not only interconnects the semiconductor light emitting device 150 with the auxiliary electrode 170 and the semiconductor light emitting device 150 with the second electrode 140, but also forms an electrical connection.

In addition, the plurality of semiconductor light emitting devices 150 constitute a light emitting device array, and the phosphor layer 180 can be formed on the light emitting device array.

The light emitting device array may include a plurality of semiconductor light emitting devices having different luminance values. Each semiconductor light emitting device 150 can constitute a unit pixel and can be electrically connected to the first electrode 120. For example, there may be a plurality of first electrodes 120, the semiconductor light emitting devices may be arranged in, for example, several columns, and the semiconductor light emitting devices in each column may be electrically connected to any one of the plurality of first electrodes.

Further, since the semiconductor light emitting devices are connected in a flip-chip form, semiconductor light emitting devices grown on a transparent dielectric substrate can be used. In addition, the semiconductor light emitting devices may be, for example, nitride semiconductor light emitting devices. Since the semiconductor light emitting device 150 has excellent luminance, individual unit pixels can be configured even with a small size.

As shown in the drawings, the partition walls 190 may be formed between the semiconductor light emitting devices 150. In this case, the partition wall 190 may serve to separate individual unit pixels from each other, and may be integrally formed with the conductive adhesive layer 130. For example, by inserting the semiconductor light emitting device 150 into the anisotropic conductive film, the base member of the anisotropic conductive film may form the partition wall.

In addition, when the base member of the anisotropic conductive film is black, the partition wall 190 may have reflective properties and increase contrast even without a separate black insulator.

As another example, a reflective partition wall may be separately provided as the partition wall 190. In this case, the partition wall 190 may include a black or white insulator depending on the purpose of the display device. When the partition walls made of a white insulator are used, reflectivity may be increased, and when the partition walls made of a black insulator are used, it is possible to have reflective properties and increase contrast.

The phosphor layer 180 may be located on the outer surface of the semiconductor light emitting device 150. For example, the semiconductor light emitting device 150 can be a blue semiconductor light emitting device that emits blue (B) light, and the phosphor layer 180 functions to convert the blue (B) light into the color of a unit pixel. The phosphor layer 180 may be a red phosphor 181 or a green phosphor 182 constituting an individual pixel.

That is, a red phosphor 181 capable of converting blue light into red (R) light may be stacked on the blue semiconductor light emitting device at a position constituting the red unit pixel. In addition, a green phosphor 182 capable of converting blue light into green (G) light may be stacked on the blue semiconductor light emitting device at a position forming the green unit pixel. In addition, only the blue semiconductor light emitting device may be used alone in the portion constituting the blue unit pixel. In this case, unit pixels of red (R), green (G), and blue (B) may form one pixel. More specifically, a phosphor of one color may be stacked along each line of the first electrode 120. Accordingly, one line in the first electrode 120 may be an electrode for controlling one color. That is, red (R), green (G), and blue (B) may be sequentially disposed along the second electrode 140, thereby realizing a unit pixel.

However, the present invention is not limited thereto, and instead of the phosphor, the semiconductor light emitting device 150 and the quantum dot (QD) can be implemented to form red (R), green (G), and blue (B) unit pixels.

In addition, a black matrix 191 may be disposed between each of the phosphor layers to improve contrast. That is, the black matrix 191 may improve contrast of light and dark.

However, the present invention is not limited thereto, and other structures for implementing blue, red, and green colors may be applied.

Referring to FIG. 5A, each semiconductor light emitting device 150 is mainly gallium nitride (GaN), indium (In) and/or aluminum (Al) can be added together to emit various light including blue and to be implemented as a high-output light emitting device.

In this case, the semiconductor light emitting device 150 may be a red, green, and blue semiconductor light emitting device to form a sub-pixel, respectively. For example, red, green, and blue semiconductor light emitting devices R, G, and B are alternately disposed, and unit pixels of red, green, and blue are formed by the red, green and blue semiconductor light emitting devices. The pixels form one pixel, through which a full-color display can be realized.

Referring to FIG. 5B, the semiconductor light emitting device may include a white light emitting device W in which a yellow phosphor layer is provided for each device. In this case, a red phosphor layer 181, a green phosphor layer 182, and a blue phosphor layer 183 may be provided on the white light emitting device W to form a unit pixel. In addition, a unit pixel may be formed on the white light emitting device W by using a color filter in which red, green, and blue are repeated.

Referring to FIG. 5C, a structure in which a red phosphor layer 181, a green phosphor layer 182, and a blue phosphor layer 183 are provided on the ultraviolet light emitting device UV can be also possible. In this way, the semiconductor light emitting device can be used in the entire range of visible light as well as ultraviolet (UV) light, and can be extended to the form of a semiconductor light emitting device in which UV light can be used as an excitation source of the upper phosphor.

Referring back to this example, the semiconductor light emitting device 150 is positioned on the conductive adhesive layer 130 to constitute a unit pixel in the display device. Since the semiconductor light emitting device 150 has excellent luminance, individual unit pixels can be configured even with a small size. The size of the individual semiconductor light emitting device 150 may have a side length of 80 μm or less, and may be a rectangular or square device. In the case of a rectangle, the size may be 20×80 μm or less.

In addition, even when a square semiconductor light emitting device 150 having a side length of 10 μm can be used as a unit pixel, sufficient brightness to form a display device can appear. Accordingly, for example, when the unit pixel is a rectangular pixel having one side of 600 μm and the other side of 300 μm, the distance between the semiconductor light emitting devices is relatively large. Accordingly, in this case, it is possible to implement a flexible display device having a high picture quality higher than or equal to HD picture quality.

The display device using the semiconductor light emitting device described above can be manufactured by a new type of manufacturing method. Hereinafter, the manufacturing method will be described with reference to FIG. 6.

FIG. 6 is a cross-sectional view illustrating a method of manufacturing a display device using the semiconductor light emitting device of the present invention.

Referring to this figure, a conductive adhesive layer 130 can be firstly formed on the insulating layer 160 on which the auxiliary electrode 170 and the second electrode 140 are positioned. An insulating layer 160 is laminated on the first substrate 110 to form one substrate (or wiring board), and the wiring substrate includes a first electrode 120, an auxiliary electrode 170, and a second electrode 140. In this case, the first electrode 120 and the second electrode 140 may be disposed in a mutually orthogonal direction. In addition, in order to implement a flexible display device, the first substrate 110 and the insulating layer 160 may each include glass or polyimide (PI).

The conductive adhesive layer 130 may be implemented by, for example, an anisotropic conductive film, and for this purpose, the anisotropic conductive film may be applied to the substrate on which the insulating layer 160 is located.

Next, the second substrate 112 corresponding to the positions of the auxiliary electrode 170 and the second electrodes 140 and on which the plurality of semiconductor light emitting devices 150 constituting the individual pixels are located is formed as the semiconductor light emitting diode. The semiconductor light emitting devices 150 can be disposed to face the auxiliary electrode 170 and the second electrode 140.

In this case, the second substrate 112 can be a growth substrate on which the semiconductor light emitting devices 150 are grown, and may be a sapphire substrate or a silicon substrate.

When the semiconductor light emitting device is formed in units of wafers, the semiconductor light emitting device can be effectively used in a display device by having an interval and a size that can form a display device.

Next, the wiring board and the second board 112 are thermocompression-bonded. For example, the wiring substrate and the second substrate 112 may be thermocompression-bonded by applying an ACF press head. The wiring substrate and the second substrate 112 are bonded by the thermocompression bonding. Due to the properties of the anisotropic conductive film having conductivity by thermocompression bonding, only a portion between the semiconductor light emitting device 150 and the auxiliary electrode, the second electrode 140 has conductivity, and through this, the electrodes and the semiconductor light emitting device 150 may be electrically connected. At this time, the semiconductor light emitting device 150 is inserted into the anisotropic conductive film, through which a partition wall may be formed between the semiconductor light emitting devices 150.

Next, the second substrate 112 can be removed. For example, the second substrate 112 may be removed using a laser lift-off (LLO) method or a chemical lift-off (CLO) method.

Finally, the second substrate 112 is removed to expose the semiconductor light emitting devices 150 to the outside. If necessary, a transparent insulating layer (not shown) may be formed by coating silicon oxide (SiOx) on the wiring board to which the semiconductor light emitting device 150 is coupled.

The method may further include forming a phosphor layer on one surface of the semiconductor light emitting device 150. For example, the semiconductor light emitting device 150 is a blue semiconductor light emitting device that emits blue (B) light, and a red phosphor or a green phosphor for converting the blue (B) light into the color of the unit pixel may be formed on one surface of the blue semiconductor light emitting device.

The manufacturing method or structure of a display device using the semiconductor light emitting device described above may be modified in various forms. As an example, a vertical semiconductor light emitting device may also be applied to the display device described above. Hereinafter, a vertical structure will be described with reference to FIGS. 5 and 6.

In addition, in the modified example or embodiment described below, the same or similar reference numerals are assigned to the same or similar components as in the previous example, and the description is replaced with the first description.

FIG. 7 is a perspective view showing another embodiment of a display device using the semiconductor light emitting device of the present invention, FIG. 8 is a cross-sectional view taken along line D-D of FIG. 7, and FIG. 9 is a conceptual diagram showing the vertical semiconductor light emitting device of FIG. 8.

Referring to the drawings, the display device may be a display device using a passive matrix (PM) type vertical semiconductor light emitting device.

The display device may include a substrate 210, a first electrode 220, a conductive adhesive layer 230, a second electrode 240, and a plurality of semiconductor light emitting devices 250.

The substrate 210 can be a wiring substrate on which the first electrode 220 is disposed, and can include polyimide (PI) to implement a flexible display device. In addition, any material that has insulating properties and is flexible may be used.

The first electrode 220 may be positioned on the substrate 210, and may be formed as a bar-shaped electrode long in one direction. The first electrode 220 may serve as a data electrode.

The conductive adhesive layer 230 may be formed on the substrate 210 on which the first electrode 220 is located. Like a display device to which a flip chip type light emitting device is applied, the conductive adhesive layer 230 may be an anisotropic conductive film (ACF), an anisotropic conductive paste, and a solution containing conductive particles and so on. However, in this embodiment as well, a case in which the conductive adhesive layer 230 is implemented by an anisotropic conductive film is exemplified.

When the semiconductor light emitting device 250 is connected by applying heat and pressure after positioning the anisotropic conductive film on the substrate 210 in a state where the first electrode 220 is positioned, the semiconductor light emitting device 250 is electrically connected to the first electrode 220. In this case, the semiconductor light emitting device 250 is preferably disposed on the first electrode 220.

The electrical connection is created because, as described above, when heat and pressure are applied to the anisotropic conductive film, it partially has conductivity in the thickness direction. Accordingly, the anisotropic conductive film is divided into a conductive portion and a non-conductive portion in the thickness direction.

In addition, since the anisotropic conductive film contains an adhesive component, the conductive adhesive layer 230 implements not only electrical connection but also mechanical bonding between the semiconductor light emitting device 250 and the first electrode 220.

As described above, the semiconductor light emitting device 250 is positioned on the conductive adhesive layer 230 and constitutes individual pixels in the display device through this. Since the semiconductor light emitting device 250 has excellent luminance, individual unit pixels can be configured even with a small size. The size of such an individual semiconductor light emitting device 250 may have a side length of 80 μm or less, and may be a rectangular or square device. In the case of a rectangle, the size may be 20×80 μm or less.

The semiconductor light emitting device 250 may have a vertical structure.

A plurality of second electrodes 240 disposed in a direction crossing the longitudinal direction of the first electrode 220 between the vertical semiconductor light emitting devices and electrically connected to the vertical semiconductor light emitting device 250 are provided.

Referring to FIG. 9, such a vertical semiconductor light emitting device includes a p-type electrode 256, a p-type semiconductor layer 255 formed on the p-type electrode 256, and a p-type semiconductor layer 255 formed on the p-type semiconductor layer 255. It includes an active layer 254, an n-type semiconductor layer 253 formed on the active layer 254, and an n-type electrode 252 formed on the n-type semiconductor layer 253. In this case, the lower p-type electrode 256 may be electrically connected to the first electrode 220 and the conductive adhesive layer 230, and the upper n-type electrode 252 may be electrically connected to a second electrode 240 to be described later. The vertical semiconductor light emitting device 250 has a great advantage in that it can reduce the chip size because electrodes can be arranged up and down.

Referring back to FIG. 8, a phosphor layer 280 may be formed on one surface of the semiconductor light emitting device 250. For example, the semiconductor light emitting device 250 is a blue semiconductor light emitting device 251 that emits blue (B) light, and a phosphor layer 280 for converting the blue (B) light into the color of a unit pixel can be provided. In this case, the phosphor layer 280 may be a red phosphor 281 and a green phosphor 282 constituting individual pixels.

That is, a red phosphor 281 capable of converting blue light into red (R) light may be stacked on the blue semiconductor light emitting device at a position constituting a unit pixel of red color, and at a position constituting a unit pixel of green color, a green phosphor 282 capable of converting blue light into green (G) light may be stacked on a blue semiconductor light emitting device. In addition, only the blue semiconductor light emitting device may be used alone in the portion constituting the blue unit pixel. In this case, unit pixels of red (R), green (G), and blue (B) may form one pixel.

However, the present invention is not limited thereto, and as described above in a display device to which a flip chip type light emitting device is applied, other structures for realizing blue, red, and green may be applied.

Referring to the present embodiment again, the second electrode 240 is positioned between the semiconductor light emitting devices 250 and is electrically connected to the semiconductor light emitting devices 250. For example, the semiconductor light emitting devices 250 may be arranged in a plurality of columns, and the second electrode 240 may be located between the columns of the semiconductor light emitting devices 250.

Since the distance between the semiconductor light-emitting devices 250 constituting individual pixels is sufficiently large, the second electrode 240 may be positioned between the semiconductor light-emitting devices 250.

The second electrode 240 may be formed as a long bar-shaped electrode in one direction, and may be disposed in a direction perpendicular to the first electrode.

Also, the second electrode 240 and the semiconductor light emitting device 250 may be electrically connected to each other by a connection electrode protruding from the second electrode 240. More specifically, the connection electrode may be an n-type electrode of the semiconductor light emitting device 250. For example, the n-type electrode is formed as an ohmic electrode for ohmic contact, and the second electrode covers at least a portion of the ohmic electrode by printing or deposition. Through this, the second electrode 240 and the n-type electrode of the semiconductor light emitting device 250 may be electrically connected.

As shown in drawing, the second electrode 240 may be positioned on the conductive adhesive layer 230. In some cases, a transparent insulating layer (not shown) including silicon oxide (SiOx) may be formed on the substrate 210 on which the semiconductor light emitting device 250 is formed. When the second electrode 240 is positioned after the transparent insulating layer is formed, the second electrode 240 is positioned on the transparent insulating layer. In addition, the second electrode 240 may be formed to be spaced apart from the conductive adhesive layer 230 or the transparent insulating layer.

If a transparent electrode such as indium tin oxide (ITO) is used to position the second electrode 240 on the semiconductor light emitting device 250, there is no problem in that the ITO material doesn't have good adhesion to the n-type semiconductor layer. Accordingly, the present invention has the advantage of not using a transparent electrode such as ITO by locating the second electrode 240 between the semiconductor light emitting devices 250. Therefore, it is possible to improve light extraction efficiency by using a conductive material having good adhesion to the n-type semiconductor layer as a horizontal electrode without being limited by the transparent material selection.

As shown in the figure, a partition wall 290 may be positioned between the semiconductor light emitting devices 250. That is, a partition wall 290 may be disposed between the vertical semiconductor light emitting devices 250 to isolate the semiconductor light emitting devices 250 constituting individual pixels. In this case, the partition wall 290 may serve to separate individual unit pixels from each other, and may be integrally formed with the conductive adhesive layer 230. For example, by inserting the semiconductor light emitting device 250 into the anisotropic conductive film, the base member of the anisotropic conductive film may form the partition wall.

In addition, when the base member of the anisotropic conductive film is black, the partition wall 290 may have reflective properties and increase contrast even without a separate black insulator.

As another example, as the partition wall 190, a reflective partition wall may be separately provided. The partition wall 290 may include a black or white insulator depending on the purpose of the display device.

If the second electrode 240 is directly positioned on the conductive adhesive layer 230 between the semiconductor light emitting device 250, the partition wall 290 can be located between the vertical semiconductor light emitting device 250 and the second electrode 240. Accordingly, individual unit pixels can be configured even with a small size using the semiconductor light emitting device 250, and the distance between the semiconductor light emitting devices 250 is relatively large enough to connect the second electrode 240 to the semiconductor light emitting device 250, and there is an effect of realizing a flexible display device having HD image quality.

Also, as shown in the drawings, a black matrix 291 may be disposed between each phosphor in order to improve a contrast ratio. That is, the black matrix 291 may improve contrast of light and dark.

As described above, the semiconductor light emitting device 250 is positioned on the conductive adhesive layer 230 and constitutes individual pixels in the display device through this. Since the semiconductor light emitting device 250 has excellent luminance, individual unit pixels can be configured even with a small size. Accordingly, a full-color display in which unit pixels of red (R), green (G), and blue (B) constitute one pixel may be implemented by the semiconductor light emitting device.

FIG. 10 is a diagram schematically illustrating a structure of a semiconductor light emitting device according to another embodiment of the present invention.

In the following drawings, it is assumed that the semiconductor light emitting device 1000 is a horizontal type semiconductor light emitting device. However, the embodiment of the present invention is not limited to the horizontal type semiconductor light emitting device, and may be similarly applied to the vertical type semiconductor light emitting device.

In addition, in the following drawings, an upper direction of the semiconductor light emitting device 1000 may mean a direction in which the magnetic layer 1050 is positioned, and a lower direction may mean a direction in which the n-type semiconductor layer 1010 is positioned. In this case, light extracted from the semiconductor light emitting device 1000 may be emitted to the outside through the upper portion of the semiconductor light emitting device 1000.

Referring to FIG. 10, the semiconductor light emitting device 1000 may include an n-type semiconductor layer 1010 and a p-type semiconductor layer 1030 formed on the n-type semiconductor layer 1010. Each of the n-type semiconductor layer 1010 and the p-type semiconductor layer 1030 has gallium nitride (GaN) or gallium arsenide (GaAs) as a main material, and indium (In), aluminum (Al), or like and can emit colored light.

Meanwhile, the semiconductor light emitting device 1000 may include a magnetic layer 1050 having a magnetic material. The magnetic layer 1050 may include a magnetic metal such as nickel (Ni).

In FIG. 10, the magnetic layer 1050 is illustrated as being disposed on the p-type semiconductor layer 1030, but the arrangement position of the magnetic layer 1050 may be changed according to the manufacturing method of the semiconductor light emitting device 1000.

As will be described later with reference to FIG. 11, the semiconductor light emitting device 1000 may be injected into a fluid to be assembled on a substrate. Since the semiconductor light emitting device 1000 injected into the fluid includes the magnetic layer 1050, it can be moved to the substrate by a magnetic field and assembled on the substrate.

Meanwhile, the passivation layer 1070 may be formed to surround the top and side surfaces of the semiconductor light emitting device 1000. Since the passivation layer 1070 is formed while the semiconductor light emitting device 1000 is connected to a growth substrate (not shown), the passivation layer 1070 may not be formed on a bottom surface of the semiconductor light emitting device 1000.

The passivation layer 1070 is formed through an inorganic insulator such as silica or alumina, PECVD (Plasma Enhanced Chemical Vapor Deposition), LPCVD (Low Pressure CVD), sputtering deposition method, or the like. Also, it may be formed through a method of spin coating an organic material such as a photoresist or polymer material.

Meanwhile, an n-type electrode may be connected to the n-type semiconductor layer 1010, and a p-type electrode may be connected to the p-type semiconductor layer 1030. To this end, some regions of the n-type semiconductor layer 1010 and the p-type semiconductor layer 1030 are exposed to the outside. Accordingly, in a subsequent manufacturing process of the display device, a portion of the passivation layer 1070 may be etched. This will be described later with reference to FIGS. 14 and 16.

FIG. 11 is a view showing an embodiment of a method in which the semiconductor light emitting device having the structure shown in FIG. 10 is assembled on a substrate by a self-assembly method, and FIG. 12 is an enlarged view of part A of FIG. 11.

An example in which a semiconductor light emitting device is assembled on a substrate by a self-assembly method using an electromagnetic field will be briefly described in FIGS. 11 to 12.

Referring to FIGS. 11 and 12, the semiconductor light emitting device 1000 may be introduced into a chamber 1300 filled with a fluid 1200.

Thereafter, the substrate 1100 may be disposed on the chamber 1300. According to an embodiment, the substrate 1100 may be introduced into the chamber 1300.

A pair of electrodes 1111 and 1112 corresponding to each of the semiconductor light emitting devices 1000 to be assembled may be formed on the substrate 1100. The electrodes 1111 and 1112 may be implemented as a transparent electrode (ITO) or other common materials. The electrodes 1111 and 1112 may correspond to a pair of assembly electrodes for fixing the assembled semiconductor light emitting device 1000 by emitting an electric field as a voltage is applied thereto. The gap between the electrodes 1111 and 1112 is formed to be smaller than the width of the semiconductor light emitting device 1000 and the width of the coupling hole 1102, so that the assembly position of the semiconductor light emitting device 1000 using an electric field can be more precisely fixed.

An insulating layer 1120 is formed on the electrodes 1111 and 1112 to protect the electrodes 1111 and 1112 from the fluid 1200 and to prevent leakage of current flowing through the electrodes 1111 and 1112. For example, the insulating layer 1120 may be formed of a single layer or multiple layers of an inorganic insulator such as silica or alumina or an organic insulator. The insulating layer 1120 may have a minimum thickness for preventing damage to the electrodes 1111 and 1112 during assembly of the semiconductor light emitting device 1000, and a maximum thickness for stably assembling the semiconductor light emitting device 1000.

A partition wall 1130 may be formed on the insulating layer 1120. Partial regions of the partition wall 1130 may be positioned on the electrodes 1111 and 1112, and the remaining regions may be positioned on the substrate 1100.

For example, when the substrate 1100 is manufactured, a portion of the partition wall formed on the entire upper portion of the insulating layer 1120 is removed such that a coupling hole 1102 in which the semiconductor light emitting devices 1000 are coupled to the substrate 1100 and assembled may be formed.

A coupling hole 1102 to which the semiconductor light emitting devices 1000 are coupled is formed in the substrate 1100, and a surface on which the coupling hole 1102 is formed may be in contact with the fluid 1200. The coupling hole 1102 may guide an accurate assembly position of the semiconductor light emitting device 1000.

Meanwhile, the coupling hole 1102 may have a shape and a size corresponding to the shape of the semiconductor light emitting device 1000 to be assembled at a corresponding position. Accordingly, it is possible to prevent assembling other semiconductor light emitting devices or assembling a plurality of semiconductor light emitting devices in the coupling hole 1102.

After the substrate 1100 is disposed, the assembly apparatus 1400 including the magnetic material may move along the substrate 1100. The assembling apparatus 1400 may move while in contact with the substrate 1100 in order to maximize the area applied by the magnetic field into the fluid 1200. According to an embodiment, the assembling apparatus 1400 may include a plurality of magnetic materials or a magnetic material having a size corresponding to that of the substrate 1100. In this case, the moving distance of the assembling apparatus 1400 may be limited within a predetermined range.

The semiconductor light emitting device 1000 in the chamber 1300 may move toward the assembling device 1400 by the magnetic field generated by the assembling device 1400.

The semiconductor light emitting device 1000 may come into contact with the substrate 1100 by entering the coupling hole 1102 while moving toward the assembly apparatus 1400. For example, a pattern or shape for the n-type semiconductor layer 1010 of the semiconductor light emitting device 1000 to contact the substrate 1100 may be formed in the coupling hole 1102 and/or the semiconductor light emitting device 1000.

In addition, by the electric field applied by the electrodes 1111 and 1112 formed on the substrate 1100, separating of the semiconductor light emitting device 1000 in contact with the substrate 1100 by the movement of the assembly apparatus 1400 can be prevented.

That is, by the self-assembly method using the above-described electromagnetic field, the time required for each of the semiconductor light emitting devices to be assembled on the substrate can be rapidly reduced, so that a large-area high-pixel display can be implemented more quickly and economically.

However, in the self-assembly method, since the semiconductor light emitting device 1000 is assembled to the substrate 1100 by an electric field, when the application of the electric field is stopped, a problem in that the semiconductor light emitting device 1000 is separated from the substrate 1100 may occur. In addition, for processes such as etching or electrode connection performed after assembly of the semiconductor light emitting device 1000, the semiconductor light emitting device 1000 needs to be physically or chemically firmly fixed to the substrate 1100.

A method of manufacturing a display device according to an embodiment of the present invention for solving the above-described problem will be described with reference to FIGS. 13 to 14 below.

FIGS. 13A to 13D are cross-sectional views illustrating a process for fixing the semiconductor light emitting device according to the embodiment of FIG. 10 to a substrate.

In the following drawings, the direction in which the upper surface of the semiconductor light emitting device 1000 faces is defined as a front surface of the display device.

Referring to FIG. 13A, as described above with reference to FIGS. 11 to 12, the semiconductor light emitting device 1000 may be assembled on the substrate 1100. The assembled semiconductor light emitting device 1000 may maintain an assembled state on the substrate 1100 by an electric field applied through the electrodes 1111 and 1112. In this case, since the semiconductor light emitting device 1000 is not physically or chemically directly assembled on the substrate 1100, problems such as movement or separation of the semiconductor light emitting device 1000 due to an external impact may occur.

Meanwhile, a space S1 may be formed between the semiconductor light emitting device 1000 and the substrate 1100 by the electrodes 1111 and 1112 formed on the substrate 1100. Specifically, the semiconductor light emitting device 1000 may be assembled to be spaced apart from the upper surface of the substrate 1100 by the electrodes 1111 and 1112 and the insulating layer 1120. Accordingly, a space S1 may be formed between the bottom surface of the semiconductor light emitting device 1000 and the top surface of the substrate 1100 and between the electrodes 1111 and 1112. In order to form the space S1, a distance between the electrodes 1111 and 1112 may be shorter than a horizontal width of the semiconductor light emitting device 1000.

After the semiconductor light emitting device 1000 is assembled, the semiconductor light emitting device 1000 and the substrate 1100 are dried, and the voltage applied to the electrodes 1111 and 1112 may be released.

Referring to FIG. 13B, a photosensitive organic insulator (photosensitizer) 1140 may be formed on the semiconductor light emitting device 1000 and the substrate 1100. For example, the photosensitive organic insulator 1140 may be formed by applying a photosensitive agent having a positive tone, such as a photosensitive acrylate or PAC (Photo Active Compounds), by a spray method or spin coating. The photosensitizer of the positive tone means a photosensitizer from which an area exposed to light is developed and removed.

In this case, the photosensitive organic insulator 1140 may be formed in the space S1 between the lower portion of the semiconductor light emitting device 1000 and the substrate 1100 as well as the upper portion of the semiconductor light emitting device 1000.

Referring to FIGS. 13C and 13D, an exposure process of irradiating light (for example, ultraviolet light) to the photosensitive organic insulator 1140 formed on the front surface of the display device may be performed.

The photosensitive organic insulator 1141 formed on the semiconductor light emitting device 1000 and the substrate 1100 may be developed and removed by being directly irradiated with ultraviolet light. On the other hand, the photosensitive organic insulator 1142 formed in the space S1 between the bottom surface of the semiconductor light emitting device 1000 and the substrate 1100 is not removed because the ultraviolet light is not irradiated and remains (filled) in the space S1. The photosensitive organic insulator 1142 remaining in the space S1 may be cured by heat to secure chemical resistance, and the semiconductor light emitting device 1000 may be firmly fixed to the substrate 1100.

Meanwhile, after the semiconductor light emitting device 1000 is fixed to the substrate 1100 by the photosensitive organic insulator 1142, a process of removing the magnetic layer 1050 may be additionally performed. As the magnetic layer 1050 is removed, the amount of light emitted to the upper portion of the semiconductor light emitting device 1000 increases, so that the light emitting efficiency of the semiconductor light emitting device 1000 may be increased.

That is, in the method of manufacturing the display device according to the embodiment shown in FIGS. 13A to 13D, the semiconductor light emitting device 1000 can be effectively fixed to the substrate 1100 through the application and exposure process of a photosensitive organic insulator.

In addition, according to an embodiment of the present invention, since the semiconductor light emitting device 1000 can be fixed to the substrate 1100 without applying pressure to the semiconductor light emitting device 1000 or the substrate 1100, the semiconductor by the pressure deformation or damage to the light emitting device 1000 or the substrate 1100 may be prevented.

FIGS. 14A to 14D are cross-sectional views illustrating a method of manufacturing a display device using a semiconductor light emitting device according to the embodiment of FIG. 10.

Referring to FIG. 14A, in order to connect the n-type electrode to the n-type semiconductor layer 1010 of the semiconductor light emitting device 1000, a partial region of the n-type semiconductor layer 1010 is to be exposed to the outside. To this end, an etching process of etching the passivation layer 1070 and the p-type semiconductor layer 1030 present on the partial region may be performed.

When describing an example of the etching process in detail, a photosensitive agent 1150 may be firstly to the semiconductor light emitting device 1000 and the substrate 1100. The photosensitizer 1150 may be substantially the same as or similar to the photosensitive organic insulator 1140 described above with reference to FIGS. 13A to 13D.

After the photosensitizer 1150 is applied, the photosensitizer in an area corresponding to the predefined etch area 1152 may be removed by exposure. Accordingly, a portion of the semiconductor light emitting device 1000 and a portion of the substrate 1100 positioned in the etch region 1152 may be exposed upwardly.

Next, an etching process may be performed on the upper exposed region. For example, in the etching process, a part of the passivation layer 1070, the p-type semiconductor layer 1030, and the n-type semiconductor layer 1010 are etched using a reactive ion etching (RIE) apparatus, but is not limited thereto. The RIE apparatus may perform etching using ions and radicals present as an etching gas (for example, argon (Ar), chlorine ($Cl_2$), boron trichloride ($BCl_3$) or the like) is formed in a plasma state.

According to the etching process for the etched region 1152, a partial region of the n-type semiconductor layer 1010 may be exposed to the outside. After the etching process is completed, the remaining photoresist 1150 may be removed through an exposure process.

Meanwhile, a region corresponding to the p-type semiconductor layer 1030 remaining after the etching process is performed may be defined as a mesa region. The mesa region may correspond to a region in which light is intensively generated and the generated light is emitted to the outside.

Referring to FIG. 14B, after an etching process is performed, a passivation layer 1160 may be formed on the semiconductor light emitting device 1000 and the substrate 1100. The passivation layer 1160 may be substantially the same as the passivation layer 1070 previously formed in the semiconductor light emitting device 1000.

That is, as the etching process is performed, the semiconductor layers 1030 and 1010 exposed to the outside may be protected by the passivation layer 1160. In addition, since the passivation layer 1160 is integrally formed on the semiconductor light emitting device 1000 and the substrate 1100, the semiconductor light emitting device 1000 may be effectively fixed to the substrate 1100.

After the passivation layer 1160 is formed, in order to connect an electrode to each of the n-type semiconductor layer 1010 and the p-type semiconductor layer 1030, the passivation layers 1070 and 1160 present in each of the partial regions 1162 and 1164 of the n-type semiconductor layer 1010 and the p-type semiconductor layer 1030 may be removed by etching or the like. The partial regions 1162 and 1164 may be defined as an n-type electrode connection region 1162 and a p-type electrode connection region 1164, respectively.

Referring to FIG. 14C, in order to form an electrode connected to the semiconductor light emitting device 1000, a planarization process may be first performed on the semiconductor light emitting device 1000 and the upper portions of the substrate 1100. The planarization process may be a process of forming the planarization layer 1170 on the semiconductor light emitting device 1000 and the substrate 1100. The planarization layer 1170 may be formed of a photoactive compound (PAC) or the like.

Meanwhile, some regions 1172 and 1174 of the planarization layer 1170 formed on the semiconductor light emitting device 1000 can be removed to expose the n-type electrode connection region 1162 and the p-type electrode connection region 1164 to the outside. For example, when the planarization layer 1170 is formed of a photosensitive compound having a positive tone, the planarization layer of the partial areas 1172 and 1174 may be removed by irradiating light to the partial areas 1172 and 1174. That is, the partial regions 1172 and 1174 may be defined as trenches 1172 and 1174 through which the n-type semiconductor layer 1010 and the p-type semiconductor layer 1030 are exposed.

Referring to FIG. 14D, an electrode forming process in which an electrode is formed on the planarization layer 1170 may be performed.

The electrode forming process may be a process of forming an electrode pattern on the planarization layer 1170. In this case, a portion of the n-type electrode 1182 may extend into the first trench 1172 to be connected to the n-type semiconductor layer 1010. Also, a portion of the p-type electrode 1184 may extend into the second trench 1174 to be connected to the p-type semiconductor layer 1030.

Each of the n-type electrode 1182 and the p-type electrode 1184 may be implemented as a transparent electrode (ITO) in order to maximize the amount of light of the semiconductor light emitting device 1000.

FIG. 15 is a diagram schematically showing the structure of a semiconductor light emitting device according to another embodiment of the present invention.

Referring to FIG. 15, in the semiconductor light emitting device 1500, the mesa region described above with reference to FIG. 14A may be formed during manufacturing of the semiconductor light emitting device 1500.

When the mesa region is previously formed, the magnetic layer 1550 may be formed on the upper surface of the n-type semiconductor layer 1510, unlike the embodiment of FIG. 10. In addition, the magnetic layer 1550 may be formed at a position spaced apart from the p-type semiconductor layer 1530 in the horizontal direction. Therefore, it is possible to prevent a phenomenon in which light emitted through the mesa region is not smoothly emitted by the magnetic layer 1550.

Meanwhile, the magnetic layer 1550 is later connected between the n-type semiconductor layer 1510 and the n-type electrode 1622, and may be implemented with a metal having high electrical conductivity.

FIGS. 16A to 16D are cross-sectional views illustrating a method of manufacturing a display device using a semiconductor light emitting device according to the embodiment of FIG. 15.

Referring to FIG. 16A, the semiconductor light emitting device 1500 may be assembled to the substrate 1100 in substantially the same manner as in the embodiment described with reference to FIGS. 13A to 13D.

Referring to FIG. 16B, in order to connect electrodes to each of the n-type semiconductor layer 1510 and the p-type semiconductor layer 1530, the process of removing some regions 1602 and 1604 of the passivation layer 1570 is can be performed.

In this case, the n-type semiconductor layer 1510 may be connected to the n-type electrode through the magnetic layer 1550. Accordingly, the passivation layer present in the partial region 1602 on the magnetic layer 1550 may be removed, and the partial region 1602 may be defined as the n-type electrode connection region 1602.

Meanwhile, the passivation layer present in the partial region 1604 on the p-type semiconductor layer 1530 may be removed, and the partial region 1604 may be defined as the p-type electrode connection region 1604.

Referring to FIG. 16C, in order to form an electrode connected to the semiconductor light emitting device 1000, a planarization process may be performed on the semiconductor light emitting device 1500 and upper portions of the substrate 1100. Similar to FIG. 14C, the planarization process may be a process of forming a planarization layer 1610 on the semiconductor light emitting device 1500 and the substrate 1100. The planarization layer 1610 may be formed of a photosensitive compound (PAC) or the like.

Meanwhile, some regions 1612 and 1614 of the planarization layer 1610 formed on the semiconductor light emitting device 1500 can be removed to expose the n-type electrode connection region 1602 and the p-type electrode connection region 1604 to the outside. For example, when the planarization layer 1610 is formed of a photosensitive compound having a positive tone, the planarization layer of the partial areas 1612 and 1614 may be removed by irradiating light to the partial areas 1612 and 1614. That is, the partial regions 1612 and 1614 may be defined as trenches 1612 and 1614 exposing the n-type electrode connection region 1602 and the p-type electrode connection region 1604 upward.

Referring to FIG. 16D, electrodes 1622 and 1624 may be formed on the planarization layer 1610. The electrode forming process may be a process of forming an electrode pattern on the planarization layer 1610. In this case, a portion of the n-type electrode 1622 may extend into the first trench 1612 to be connected to the magnetic layer 1550 connected to the n-type semiconductor layer 1510. Also, a portion of the p-type electrode 1624 may extend into the second trench 1614 to be connected to the p-type semiconductor layer 1530. Each of the n-type electrode 1622 and the p-type electrode 1624 may be implemented as a transparent electrode (ITO) in order to maximize the amount of light of the semiconductor light emitting device 1500.

The above description is merely illustrative of the technical idea of the present invention, and various modifications and variations are possible without departing from the essential characteristics of the present invention by those skilled in the art to which the present invention pertains.

Therefore, the embodiments disclosed in the present invention are not intended to limit the technical spirit of the present invention, but to explain, and the scope of the technical spirit of the present invention is not limited by these embodiments.

The protection scope of the present invention should be construed by the following claims, and all technical ideas within the scope equivalent thereto should be construed as being included in the scope of the present invention.

The invention claimed is:

1. A display device comprising:
a substrate;
a pair of assembly electrodes spaced apart from each other on the substrate;
a semiconductor light emitting device assembled on the pair of assembly electrodes;
a photosensitive organic insulator applied to a space between the semiconductor light emitting device and the substrate and between the pair of assembly electrodes to fix the semiconductor light emitting device to the substrate; and
an insulating layer disposed between the pair of assembly electrodes and the semiconductor light emitting device, wherein a coupling hole defining an assembly position of the semiconductor light emitting device is disposed on the substrate, and the coupling hole corresponds to a space between barrier ribs disposed on the substrate.

2. The display device according to claim 1, wherein the photosensitive organic insulator comprises a photosensitizer having a positive tone.

3. The display device according to claim 2, wherein the photosensitive organic insulator comprises at least one of photosensitive acrylates or photo active compounds (PACs).

4. The display device according to claim 1, wherein a distance between the pair of assembly electrodes is shorter than a horizontal width of the semiconductor light emitting device.

5. The display device according to claim 1, wherein a width of the coupling hole is greater than a width of the semiconductor light emitting device.

6. The display device according to claim 1, wherein the semiconductor light emitting device comprises a magnetic layer.

7. The display device according to claim 1, wherein the pair of assembly electrodes are spaced apart from the semiconductor light emitting device and are not electrically connected to the semiconductor light emitting device.

8. A display device comprising:
a substrate;
a pair of assembly electrodes spaced apart from each other on the substrate;
a semiconductor light emitting device assembled on the pair of assembly electrodes;
a photosensitive organic insulator applied to a space between the semiconductor light emitting device and the substrate and between the pair of assembly electrodes to fix the semiconductor light emitting device to the substrate;
an insulating layer disposed between the pair of assembly electrodes and the semiconductor light emitting device; and
a planarization layer on the semiconductor light emitting device,
wherein some regions of the planarization layer on the semiconductor light emitting device are removed to expose a n-type semiconductor layer and a p-type semiconductor layer of the semiconductor light emitting device.

9. The display device according to claim 8, wherein the planarization layer is formed of a photosensitive compound having a positive tone.

10. The display device according to claim 8, further comprising:
a n-type electrode on the planarization layer and connected to the n-type semiconductor layer; and
a p-type electrode on the planarization layer and connected to the p-type semiconductor layer.

11. The display device according to claim 6, wherein the magnetic layer is disposed on an upper surface of a n-type semiconductor layer of the semiconductor light emitting device and is spaced apart from a p-type semiconductor layer of the semiconductor light emitting device in a horizontal direction.

12. The display device according to claim 11, wherein the magnetic layer comprises a metal having electrical conductivity.

13. The display device according to claim 11, wherein the n-type semiconductor layer is connected to a n-type electrode of the semiconductor light emitting device through the magnetic layer.

14. The display device according to claim 8, further comprising a passivation layer disposed between the semiconductor light emitting device and the planarization layer,
wherein the passivation layer extends along a lateral surface of the semiconductor light emitting device.

15. The display device according to claim 14, wherein a thickness of the passivation layer on the p-type semiconductor layer is different from a thickness of the passivation layer on the n-type semiconductor layer.

16. The display device according to claim 14, wherein the passivation layer contacts the insulation layer.

17. The display device according to claim 1, wherein the insulating layer is disposed on a side surface and a top surface of each of the pair of assembly electrodes.

18. The display device according to claim 8, wherein a coupling hole defining an assembly position of the semiconductor light emitting device is disposed on the substrate, and the coupling hole corresponds to a space between barrier ribs disposed on the substrate.

19. The display device according to claim 18, wherein a width of the coupling hole is greater than a width of the semiconductor light emitting device.

20. The display device according to claim 1, further comprising:
a planarization layer on the semiconductor light emitting device,
wherein the planarization layer is formed of a photosensitive compound having a positive tone, and
wherein some regions of the planarization layer on the semiconductor light emitting device are removed to expose a n-type semiconductor layer and a p-type semiconductor layer of the semiconductor light emitting device.

* * * * *